US012218483B2

(12) United States Patent
Puckett et al.

(10) Patent No.: US 12,218,483 B2
(45) Date of Patent: Feb. 4, 2025

(54) TUNABLE RF SYNTHESIZER BASED ON OFFSET OPTICAL FREQUENCY COMBS (71) Applicant: Honeywell International Inc., Charlotte, NC (US)

(72) Inventors: Matthew Wade Puckett, Phoenix, AZ (US); Jianfeng Wu, Tucson, AZ (US); Karl D. Nelson, Plymouth, MN (US); Chad Hoyt, Roseville, MN (US)

(73) Assignee: Honeywell International Inc., Charlotte, NC (US)

( * ) Notice: Subject to any disclaimer, the term of this patent is extended or adjusted under 35 U.S.C. 154(b) by 570 days.

(21) Appl. No.: 17/581,692

(22) Filed: Jan. 21, 2022

(65) Prior Publication Data

US 2023/0238773 A1 Jul. 27, 2023

(51) Int. Cl.
*G02B 6/293* (2006.01)
*G02F 1/01* (2006.01)
*H01S 5/00* (2006.01)
*H01S 5/0683* (2006.01)
*H01S 5/40* (2006.01)
*H03K 5/1252* (2006.01)
*H01S 5/12* (2021.01)

(52) U.S. Cl.
CPC .......... *H01S 5/0683* (2013.01); *G02F 1/0102* (2013.01); *H01S 5/0085* (2013.01); *H01S 5/4012* (2013.01); *H03K 5/1252* (2013.01); *G02F 2203/56* (2013.01); *H01S 5/12* (2013.01)

(58) Field of Classification Search
CPC ............ G02B 6/29338; G02B 6/29349; G02B 6/29353; G02B 6/29358; G02F 2203/56; H01S 3/30
See application file for complete search history.

(56) References Cited

U.S. PATENT DOCUMENTS

| 7,587,144 B2 | 9/2009 | Ilchenko et al. |
| 9,450,673 B2 | 9/2016 | Vahala et al. |
| 9,905,999 B2 | 2/2018 | Li et al. |
| 10,312,658 B2 | 6/2019 | Puckett |

(Continued)

OTHER PUBLICATIONS

Cizek, et al., "Two-Stage System Based on a Software-Defined Radio for Stabilizing of Optical Frequency Combs in Long-Term Experiments", Sensors, Jan. 20, 2014, pp. 1757-1770.

(Continued)

*Primary Examiner* — Joseph P Martinez
(74) *Attorney, Agent, or Firm* — Fogg & Powers LLC (57) ABSTRACT Systems and methods for a tunable RF synthesizer based on offset optical frequency combs is provided herein. An exemplary system includes two lasers, a first laser generating a first laser output and a second laser generating a second laser output; and a coupler that receives the first and second laser outputs. Further, the system includes a resonator having first and second sections coupled to one another, the coupler coupling the first and second laser outputs into the resonator; a splitter that couples the first section to the second section, the splitter splitting a first proportion of the first laser output and a second proportion of the second laser output onto different paths within the resonator; and a controller that controls the splitter to change a size of the first proportion in relation to the first laser and the second proportion in relation to the second laser.

20 Claims, 5 Drawing Sheets (56) References Cited

U.S. PATENT DOCUMENTS 10,451,806 B1 10/2019 Puckett et al.
11,362,480 B2 6/2022 Puckett et al.
11,429,010 B1* 8/2022 Puckett .................. G02F 1/113
11,431,144 B2 8/2022 Wu et al.

OTHER PUBLICATIONS

Jost, et al., Continuously Tunable, Precise, Single Frequency Optical Signal Generator, Optics Express, vol. 10, No. 12, Jun. 17, 2002, pp. 515-520.
Jung, et al., "Ultralow Phase Noise Microwave Generation From Mode-Locked ER-Fiber Lasers with Subfemtosecond Integrated Timing Jitter", IEEE Photonics Journal, vol. 5, No. 3, Jun. 2013, pp. 1-8.
Puckett, Matthew W., "Systems and Methods for a Tunable Radio Frequency Synthesizer Utilizing Optical Frequency Combs", U.S. Appl. No. 17/412,002, filed Aug. 25, 2021, pp. 1 through 30.
Spencer et al., "An Integrated-Photonics Optical-Frequency Synthesizer", National Institute of Standards and Technology, pp. 1 through 10.
Stern, et al., "Battery-Operated Integrated Frequency Comb Generator", Nature, vol. 562, Oct. 18, 2018, pp. 401-408.
Tan, et al., "RF and Microwave Photonic Temproal Signal Processing with Kerr Micro-Combs" Advances in Physics: X, 2020, vol. 6, No. 1, Nov. 12, 2020, pp. 1 through 46.
Tang, et al., "Integrated Optoelectronic Oscillator" Optics Express, Apr. 30, 18, vol. 26, No. 9, pp. 12257-12265.

* cited by examiner

TUNABLE RF SYNTHESIZER BASED ON OFFSET OPTICAL FREQUENCY COMBS

BACKGROUND

Electronic oscillators are used in many microelectronic systems in the art today. Some systems use microwave oscillators to provide the desired radio frequency (RF) standard. Although microwave oscillators are capable of extraordinarily low phase noise, they are prohibitively large for many systems where system size is a concern. Smaller systems generate RF signals using miniature oscillator architectures that often exploit optical frequency combs. In these devices, the RF frequency has been fixed at a value corresponding to the free spectral range of the resonator used to generate it. Optical frequency combs provide a way for linking radio frequency standards with optical frequencies. Applications that may use optical frequency combs may include optical metrology, atomic clocks, spectroscopy, and GNSS technology.

SUMMARY

Systems and methods for a tunable RF synthesizer based on offset optical frequency combs is provided herein. In certain embodiments, a system includes at least two lasers, wherein a first laser in the at least two lasers generates a first laser output and a second laser in the at least two lasers generates a second laser output. Additionally, the system includes a coupler that receives the first laser output and the second laser output. Further, the system includes a resonator having a first section and a second section, wherein the first section is coupled to the second section, wherein the coupler couples the first laser output and the second laser output into the resonator. Moreover, the system includes a splitter that couples the first section to the second section, wherein the splitter splits a first proportion of the first laser output and a second proportion of the second laser output onto different optical paths within the resonator to generate optical frequency combs associated with different resonant frequencies of each of the different optical paths. Also, the system includes a controller that controls the splitter to change a size of the first proportion in relation to the first laser and the second proportion in relation to the second laser.

DRAWINGS

Drawings accompany this description and depict only some embodiments associated with the scope of the appended claims. Thus, the described and depicted embodiments should not be considered limiting in scope. The accompanying drawings and specification describe the exemplary embodiments, and features thereof, with additional specificity and detail, in which:

Per common practice, the drawings do not show the various described features according to scale, but the drawings show the features to emphasize the relevance of the features to the example embodiments.

DETAILED DESCRIPTION

The following detailed description refers to the accompanying drawings that form a part of the present specification. The drawings, through illustration, show specific illustrative embodiments. However, it is to be understood that other embodiments may be used and that logical, mechanical, and electrical changes may be made.

As stated above, quality oscillators that have low phase noise are relatively large, heavy, bulky devices. For example, some oscillators that have sufficiently low phase noise have sizes on the order of a square foot or larger. Embodiments described herein provide for systems and methods that are able to achieve desired performance equivalent to that of the larger oscillators within size constraints associated with microresonators. Specifically, the systems and methods described herein provide for a tunable radio frequency synthesizer based on optical frequency combs.

In certain embodiments, a system may use optical frequency combs to generate a signal with increased tunability of the output frequency by generating two optical frequency combs in a single resonator. To generate two optical frequency combs, the resonant frequencies of a resonator are split into doublets. The system may then generate frequency combs, where each frequency comb corresponds to half of the doublet. Further, an output of the resonator may be coupled to a detector, such as a high-speed detector. The detector beats the two optical frequency combs together to generate an electrical signal associated with the frequency difference between the optical frequency combs. Thus, the RF frequency of the electrical signal generated by the detector corresponds to the tunable frequency splitting present in the resonator. Therefore, the RF frequency of the resultant electrical signal can be widely tuned by controlling the splitting of the resonant frequencies of the different frequency combs.

In additional embodiments, the splitting of the resonant frequencies is controlled by applying a control signal to a splitting device. In response to the control signal, the splitting device may change the proportion of light that is split into different resonances within the resonator. In some embodiments, the splitting device may be a coupler that couples light on one optical path onto a different optical path. When the splitting device is a coupler, the control signal may control a microheater that heats up the coupler, which heat changes the proportion of light coupled into different optical paths by the coupler. Alternatively, the control signal may control a piezoelectric transducer (PZT) that also changes the proportion of light coupled by the coupler in response to the control signal.

In some embodiments, injection-locked stimulated Brillouin scattering (SBS) lasers may provide laser outputs that are coupled into the resonator. Using injection-locked SBS lasers may reduce the phase noise of the optical pump used to generate the optical frequency combs, allowing for the provision of an electrical signal having similarly low phase noise. Accordingly, the systems and methods provided herein provide highly tunable optical frequency combs with low phase noise, which can be used to provide a highly tunable frequency signal (1 GHz to 40 GHz, for example) that can be provided in systems using microelectronics.

Figure 1:
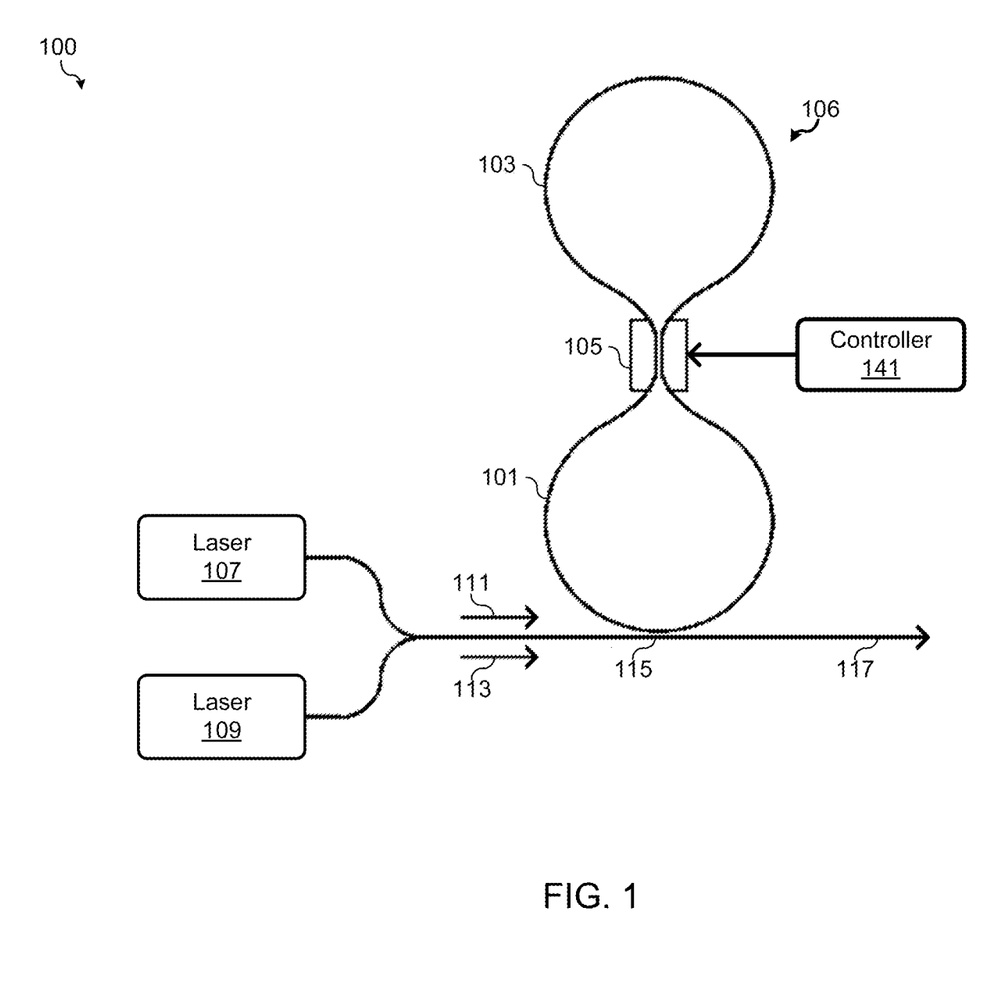
FIG. 1 is a system diagram illustrating a tunable RF synthesizer based on offset optical frequency combs according to an aspect of the present disclosure.

FIG. 1 is a system diagram illustrating a system 100 that provides a tunable RF signal based on offset optical frequency combs. As illustrated, the system 100 includes two lasers 107 and 109 that respectively generate a first laser output 111 and a second laser output 113. The system 100 may also include a coupler 115. The coupler 115 couples a portion of the first laser output 111 and the second laser output 113 into a resonator 106, where the coupled portions of the first laser output 111 and the second laser output 113 propagate around the resonator 106. Additionally, the resonator 106 has a first section 101 and a second section 103. The first section 101 and the second section 103 are connected to each other through a splitter 105. The light propagating within the resonator 106 forms optical frequency combs that are split onto different resonant frequencies for the resonator 106 as directed by a controller 141. The coupler 115 then couples a portion of the resonating optical frequency combs out of the resonator 106. The system 100 then provides the frequency combs as an output for use by other systems or for other components in a larger system of which the system 100 functions as a subsystem.

As stated above, the system 100 includes lasers 107 and 109. The lasers 107 and 109 include devices capable of generating laser light. For example, the lasers 107 and 109 may include a laser diode, such as but not limited to distributed feedback laser diodes or other laser-light generating devices. As shown, the laser 107 and the laser 109 respectively generate a first laser output 111 and a second laser output 113. Further, the lasers 107 and 109 are coupled to optical transmission media for providing the laser outputs 111 and 113 to other optical components within the system 100. The optical transmission media may include optical waveguides, optical fibers, free-space optical components, and the like.

In some embodiments, the laser outputs 111 and 113 may propagate through the optical transmission media to a coupler 115. While the system 100 shows the laser outputs 111 and 113 being directly coupled from the lasers 107 and 109 into the coupler 115, the light produced by the lasers 107 and 109 may be conditioned and controlled by other devices before being provided to the coupler 115. For example, various optical components may alter the phase, polarization, amplitude, and other characteristics of the light before being received by the coupler 115. In particular, the laser outputs 111 and 113 may be phase or amplitude modulated before being received by the coupler 115.

In certain embodiments, the coupler 115 couples a portion of the laser outputs 111 and 113 into a first section 101 of the resonator 106. The laser light then propagates about the resonator 106. In particular, the light propagates around a segment of the first section 101 and then propagates through the splitter 105 into the second section 103. The light then propagates around the second section 103 and through the splitter 105 and back into the first section 101, where the light either proceeds with propagating around the resonator 106 or exits through the coupler 115.

In certain embodiments, the light exists within the resonator 106 in the time domain as a series of pulses and in the frequency domain as a series of lines (also referred to as spikes or teeth) where the spacing between the lines is uniform. This optical frequency comb is generated in the resonator 106 as the laser propagates in a given direction (for example, in the counterclockwise (CCW) direction). For a low loss (i.e., high quality) resonator that has a third-order optical nonlinearity, the non-linear coefficient of the resonator 106 compresses the propagating light into a soliton pulse that travels around the resonator 106 in the propagation direction. That is, laser light propagating in the CW direction produces a pulse that travels around the resonator 106 in the CW direction. Similarly, laser light propagating in the counterclockwise (CCW) direction can produce a pulse that travels around the resonator 106 in the CCW direction. Each time a pulse passes through the coupler 115, a portion of the pulse will periodically exit the resonator 106 at a rate corresponding to the round-trip time of the resonator 106. In the frequency domain, this corresponds to an output where the lines of a comb are separated by the free spectral range (FSR) of the resonator 106. The output of the resonator 106 is provided as an output 117 from the system 100.

In exemplary embodiments, the splitter 105 may couple a portion of the light propagating within the resonator 106 onto a different propagation direction within the resonator. For example, the splitter 105 may couple light propagating in the CCW direction around the resonator 106 into an optical path where light propagates in the CW direction around the resonator 106. Similarly, the splitter 105 may cause a portion of the light that propagates in the CW direction to propagate in the CCW direction. The effect of this coupling causes the output of the resonator 106 to provide an optical frequency comb doublet, where the doublets are separated in frequency based on the proportion of light that is coupled by the splitter 105 into different propagation directions. Thus, the splitter 105 splits the resonances of the resonator 106 into two different resonant frequencies.

In further embodiments, the controller 141 may provide a control signal to the splitter 105 that controls the proportion of light that is coupled into different propagation directions by the splitter 105. For example, the splitter 105 may include a microheater that applies heat to a coupler within the splitter 105, where the coupler couples more or less light into different propagation directions in response to the application of heat by the microheater. The microheater applies heat within the splitter 105 as directed by the controller 141. Alternatively, the splitter 105 may include a piezoelectric transducer (PZT) that can also respond to electrical signals that change the amount of light that is coupled by the splitter 105 into different propagation paths.

In certain embodiments, the controller 141 may be a computation device, such as a processor, that controls the logical signals provided to the splitter 105. The controller 141 and/or other computation devices used in the system 100, or other systems and methods described herein, may be implemented using software, firmware, hardware, or appropriate combinations thereof. The controller 141 and other computational devices may be supplemented by, or incorporated in, specially-designed application-specific integrated circuits (ASICs) or field programmable gate arrays (FPGAs). In some implementations, the controller 141 and/or other computational devices may communicate through an additional transceiver with other computing devices outside of the system 100, such as the user interface or computing devices that may direct the operation of the splitter 105. The controller 141 and other computational devices can also include or function with software programs, firmware, or other computer-readable instructions for carrying out various process tasks, calculations, and control functions used in the methods and systems described herein.

The methods described herein may be implemented by computer-executable instructions, such as program modules or components, which are executed by at least one processor, such as the controller 141. Generally, program modules include routines, programs, objects, data components, data structures, algorithms, and the like, which perform particular tasks or implement particular abstract data types.

Instructions for carrying out the various process tasks, calculations, and generation of other data used in the operation of the methods described herein can be implemented in software, firmware, or other computer-readable instructions. These instructions are typically stored on appropriate computer program products that include computer-readable media used to store computer-readable instructions or data structures. Such a computer-readable medium may be available media that can be accessed by a general-purpose or special-purpose computer or processor, or any programmable logic device.

Suitable computer-readable storage media may include, for example, non-volatile memory devices including semiconductor memory devices such as Random Access Memory (RAM), Read Only Memory (ROM), Electrically Erasable Programmable ROM (EEPROM), or flash memory devices; magnetic disks such as internal hard disks or removable disks; optical storage devices such as compact discs (CDs), digital versatile discs (DVDs), Blu-ray discs; or any other media that can be used to carry or store desired program code in the form of computer-executable instructions or data structures.

Figure 2:
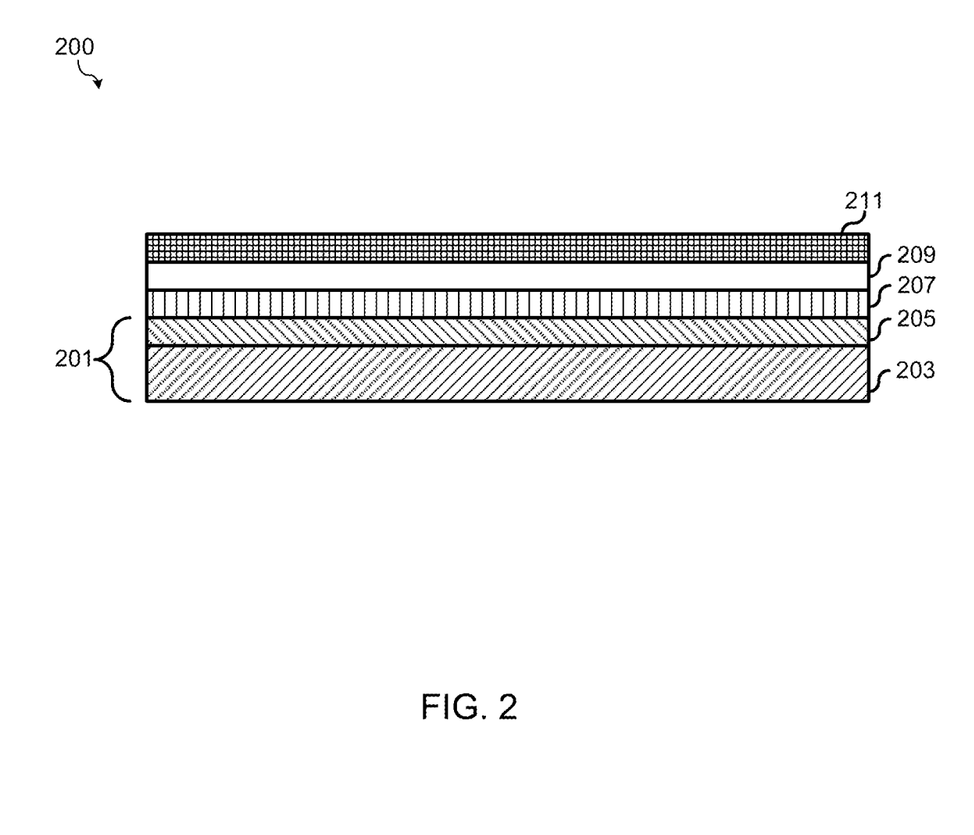
FIG. 2 is a cross-section diagram illustrating the various layers of an integrated photonic chip implementing systems described herein according to an aspect of the present disclosure.

FIG. 2 illustrates an exemplary embodiment showing the cross section of an integrated photonics chip 200 containing some of the devices in the system 100 within an integrated photonics chip 200. For example, the system 100 may be fabricated on or from a substrate wafer 201. The substrate wafer 201 may be comprised of, for example, silicon as its topmost layer 205 formed on a bottom layer 203. A layer of silicon dioxide 207 may be thermally grown on the topmost layer 205 of the substrate wafer 201. Additionally, plasma-enhanced chemical vapor deposition (PECVD) or low-pressure chemical vapor deposition (LPCVD) may deposit a layer of silicon nitride 209 on the silicon dioxide. Then, the device architecture may be etched into the layer of silicon nitride 209 through a guiding layer (not shown). The device architecture may include the resonator 106, coupler 115, splitter 105, and optical transmissive media for transmitting the laser outputs between different components in the system 100. Additionally, the device architecture may include ports and electrical connectors for coupling to external optical and electrical devices. For example, the guiding layer may be a photoresist layer and the device architecture may be etched through conventional electron-beam lithography- or photo-lithography-based procedures in combination with reactive ion etching. Following this, the guiding layer may be removed and an upper cladding layer 211, for example, silicon dioxide, may be deposited through PECVD or LPCVD. Additional steps may be included to reduce loss in the optical transmission media, for example, annealing the sample at high temperatures after the deposition of the upper cladding or removal of the residual resist layer following the reactive ion etch step. If different nitride thicknesses are desired for the lasers 107 as compared to the resonator 106 or other potential components of the system 100, the devices may be fabricated in different layers and coupled vertically to one another.

As described above, by providing a device that tunably controls the splitting of the resonant frequencies through applying a control signal to a splitting device, the system 100 provides highly tunable optical frequency combs, which can be used to provide a tunable frequency signal (1 GHz to 40 GHz, for example) in a small form factor.

Figure 3:
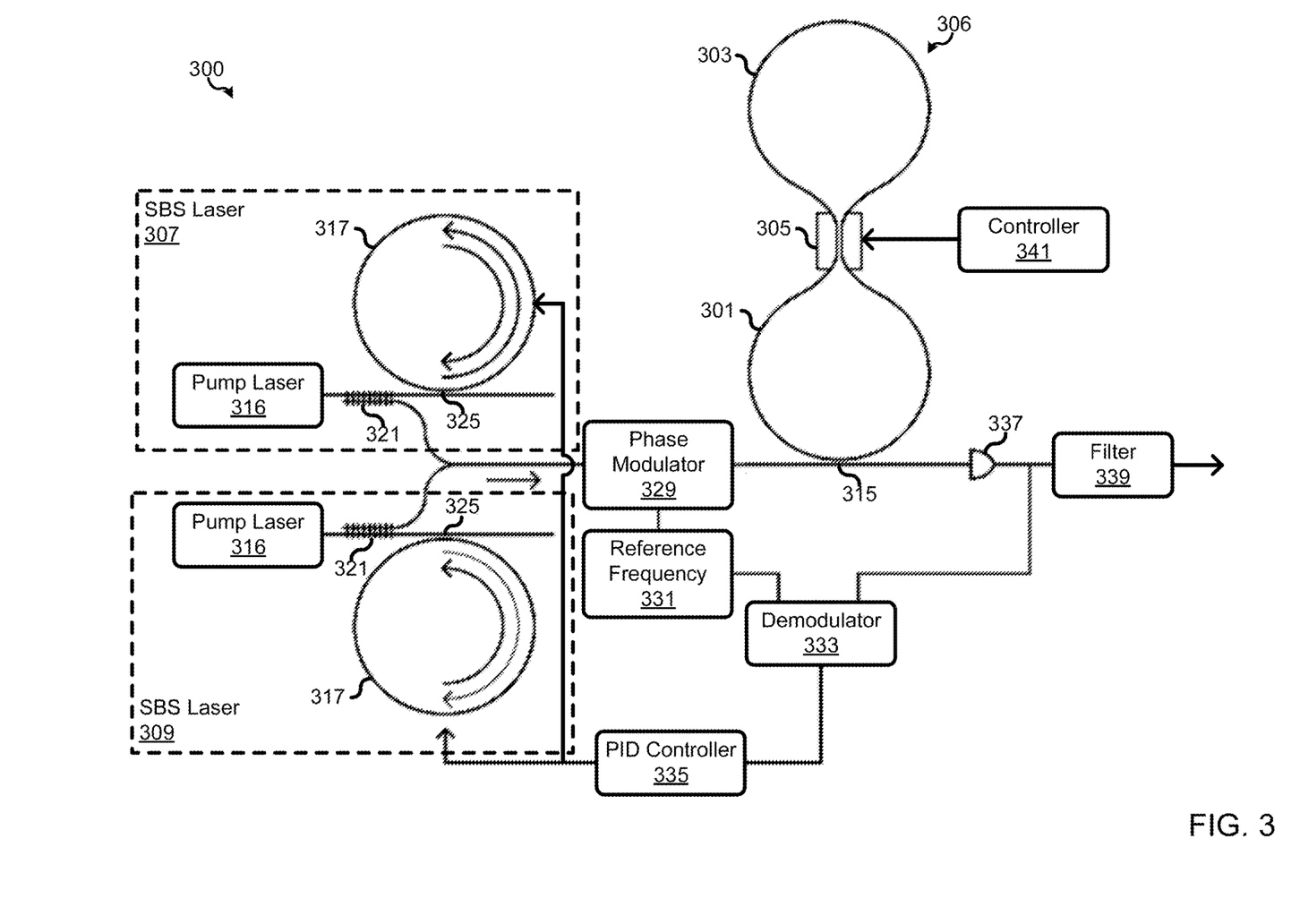
FIG. 3 is a system diagram illustrating a tunable RF synthesizer based on offset optical frequency combs that implement stimulated Brillouin scattering (SBS) lasers according to an aspect of the present disclosure.

FIG. 3 is a system diagram illustrating a tunable RF synthesizer system 300 based on offset optical frequency combs that uses stimulated Brillouin scattering (SBS) lasers as the lasers. As illustrated, the resonator 306, splitter 305, coupler 315, and controller 341 function similar to the resonator 106, splitter 105, coupler 115, and controller 141 described above in FIG. 1.

In certain embodiments, the system 300 may include a first SBS laser 307 and a second SBS laser 309. The first SBS laser may perform a similar function as the laser 107, and the second SBS laser 309 may perform a similar function as the laser 109 in FIG. 1. The first SBS laser 307 and the second SBS laser 309 may generate low-noise SBS laser output for coupling into the resonator 306.

In certain embodiments, each of the first SBS laser 307 and the second SBS laser 309 includes a pump laser 316, an SBS resonator 317, a coupler 325, and a Bragg grating filter 321. The pump laser 316 may generate laser light that is passed through the Bragg grating filter 321 for coupling by the coupler 325 into the SBS resonator 317. The pump laser 316 may be a laser diode, such as but not limited to a distributed feedback (DFB) laser diode, or another light-generating device. The light emitted from the pump laser 316 may establish an injection lock where the transmission spectrum of the SBS resonator 317 provides optical feedback that propagates back towards the pump laser 316 such that the emission wavelength of the pump laser 316 locks to one of the resonance frequencies of the SBS resonator 317.

Upon startup, the pump lasers 316 may not yet function as lasers. Instead, the pump lasers 316 may produce a spontaneous emission. The spontaneous emission propagates out from the respective pump laser 316 into the Bragg grating filter 321. The spontaneous emission may be incident on the Bragg grating filter 321 and pass through the Bragg grating filter 321 for coupling into the SBS resonator 317 by the coupler 325. At least a portion of the light coupled into the SBS resonator 317 may be at a resonant frequency of the SBS resonator 317. The portion of the light produced by the pump laser 316 that is at a resonant frequency of the SBS resonator 317 may propagate in a single direction within the SBS resonator. For example, the coupler 325 may couple light into the SBS resonator 317 that propagates in the clockwise direction around the SBS resonator 317. The on-resonance portion of the propagating light will produce backscattering within the SBS resonator 317 in the opposite direction (for example, counter-clockwise). The light propagating in the opposite direction is coupled out of the SBS resonator 317 by the coupler 325 and provided back to the Bragg grating filter 321. The Bragg grating filter 321 then diffracts the light received from the SBS resonator 317 through an output of the corresponding SBS laser 307 or SBS laser 309. The backscattered light sets a lasing frequency for the SBS lasers 307 and 309.

In additional embodiments, the system 300 may include a phase modulator 329. The phase modulator 329 may receive the light from the SBS lasers 307 and 309 and apply modulation to the laser output to create a Pound-Drever-Hall (PDH) loop to lock the SBS lasers to the resonant frequency of the resonator 306. For example, the phase modulator 329 may receive a reference signal from a reference frequency generator 331. After modulation, the light is coupled into the resonator 306 by the coupler 315.

As described above with respect to the resonator 106 in FIG. 1, the resonator 306 receives the SBS lasers 307 and 309, where the SBS lasers 307 and 309 propagate around a first section 301 and a second section 303 of the resonator 306. As the light propagates around the resonator 306, an optical frequency comb is generated. Additionally, when the light passes from the first section 301 to the second section 303, the light may pass through a splitter 305. As described above, the splitter couples a portion of the light into a different optical path such that the light propagates around the resonator 306 in the opposite direction. This coupling into the opposite direction of propagation causes the optical frequency comb to split along two different resonant frequencies, where the frequency difference of the resonant frequencies is dependent on the proportion of the light that is coupled by the splitter 305 to propagate around the resonator 306 in the opposite direction. After propagating around the resonator, the coupler 315 couples a portion of the optical frequency combs out of the resonator 306.

Similar to the system 100 described above with respect to FIG. 1, the system 300 also includes a controller 341 that controls a tunable device that can change the proportion of the light that the splitter 305 couples into the opposite propagation path. As described above, the tunable device may be a microheater, a PZT, or other similar tunable devices. The controller 341 is substantially similar to the controller 141 described above with respect to FIG. 1. In certain embodiments, after the coupler 315 couples the light out of the resonator 306, the optical frequency combs are incident on a detector 337. The detector 337 may be a high-speed photodetector or other similar device capable of sensing the light received from the coupler 315. The detector 337 generates an electrical signal by beating the received light against each other. The electrical signal will have an RF frequency (beat frequency) that corresponds to the frequency difference between the split optical frequency combs. Therefore, the RF frequency can be widely tuned. For example, the resultant RF frequency may be tunable between 1 GHz to 40 GHz merely by controlling the proportion of the light coupled by the splitter 305

In certain embodiments, after producing the electrical signal, the detector 337 may provide the electrical signal to a filter 339. The filter 339 may remove unwanted higher-order harmonics of the desired RF frequency. Also, the detector 337 may provide the electrical signal to a demodulator. The demodulator 333 may demodulate the electrical signal using the reference frequency signal produced by the reference frequency generator 331. The demodulator may then provide the demodulated electrical signal to a proportional-integral-derivative controller 335. The PID controller 335 may function as an SBS laser control device as the PID controller 335 provides control signals to actuators in the SBS lasers 307 and 309 to change the resonant frequencies of the SBS lasers 307 and 309. For example, the resonant frequencies of the SBS lasers 307 and 309 may be adjustable by sending an electrical signal to a PZT or other actuator that can adjust the resonant frequency of the SBS resonators 317. Additionally, while not shown, the PID controller 335 may also provide control signals that adjust the proportion of the light that is coupled into the resonator 306 by the coupler 315. Also, the PID controller 335 may function as the controller 341, such that the PID controller 335 controls the coupler in the splitter 305 to control the resonance splitting within the resonator 306. Devices other than the PID controller can function as an SBS laser control device. Accordingly, the system 300 provides a highly tunable RF frequency signal having low phase noise.

Figure 4:
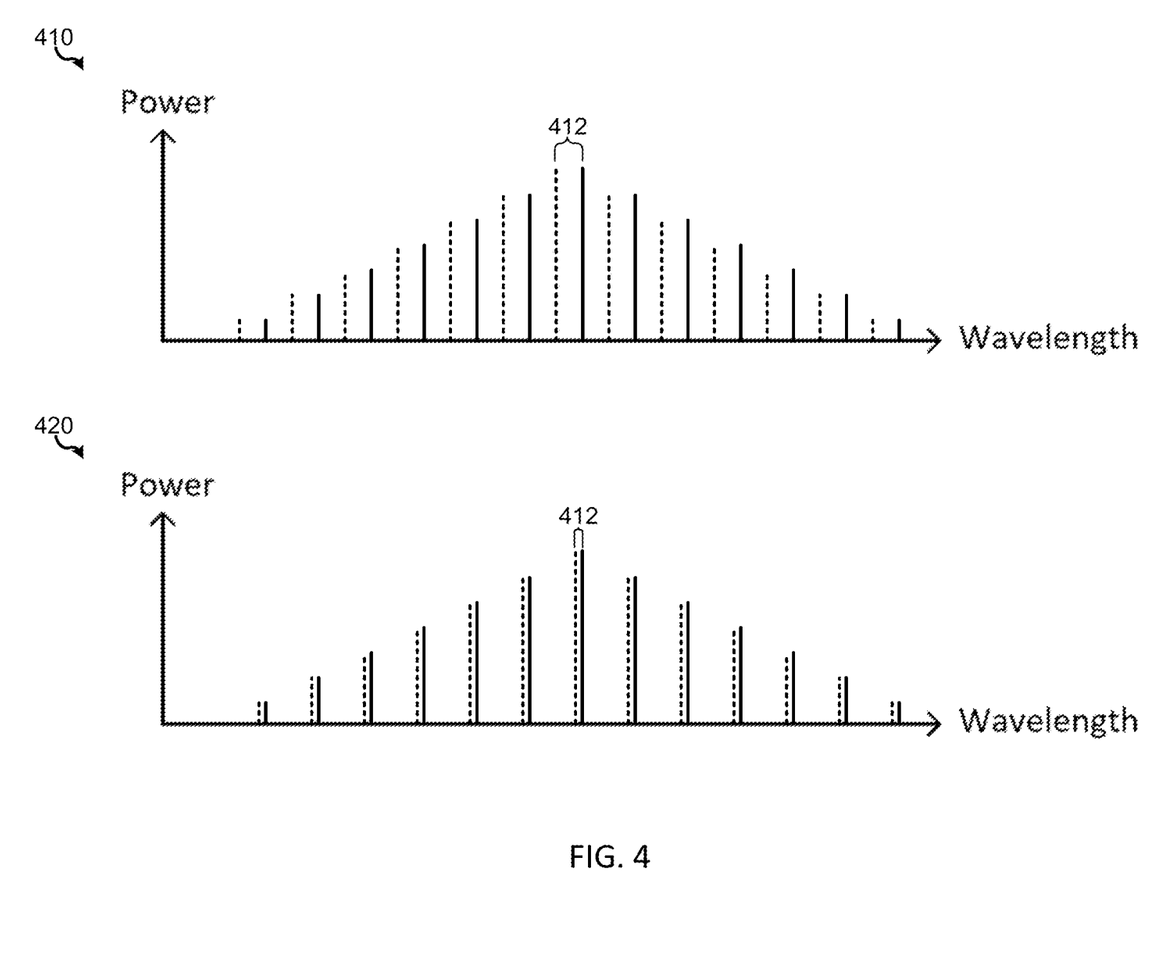
FIG. 4 provides graphs that illustrate the tunability of an RF synthesizer according to an aspect of the present disclosure.

FIG. 4 shows two graphs that illustrate the resultant optical frequency combs based on the resonance splitting within the resonator 306. A first graph 410 illustrates the resonance splitting when the splitter 305 couples half of the light into opposite propagating directions. A second graph 420 illustrates the resonance splitting when either 100% or 0% of the light is coupled by the splitter 305 into opposite propagating directions.

As shown in graph 410, where the splitter 305 couples 50% of the light into opposite propagating directions, the smallest separation 412 between the different frequencies of the different optical frequency combs is theoretically at its largest. As the controller 341 changes the proportion of light coupled into the opposite propagating directions, the splitting of the optical frequency combs may change proportionately. For example, if the proportion of coupled light increases from 50%, the splitting will increase, causing the smallest separation 412 between the different frequencies of the different optical frequency combs to decrease. Similarly, if the proportion of coupled light decreases from 50%, the splitting will decrease, causing the smallest separation 412 between the different frequencies of the different optical frequency combs to also decrease. For example, graph 420 illustrates an example where either 100% or 0% of the light is coupled into the opposite propagating directions. When either 100% or 0% of the light is coupled, the smallest separation 412 is substantially small such that the different optical frequency combs have substantially the same frequencies or no splitting.

Figure 5:
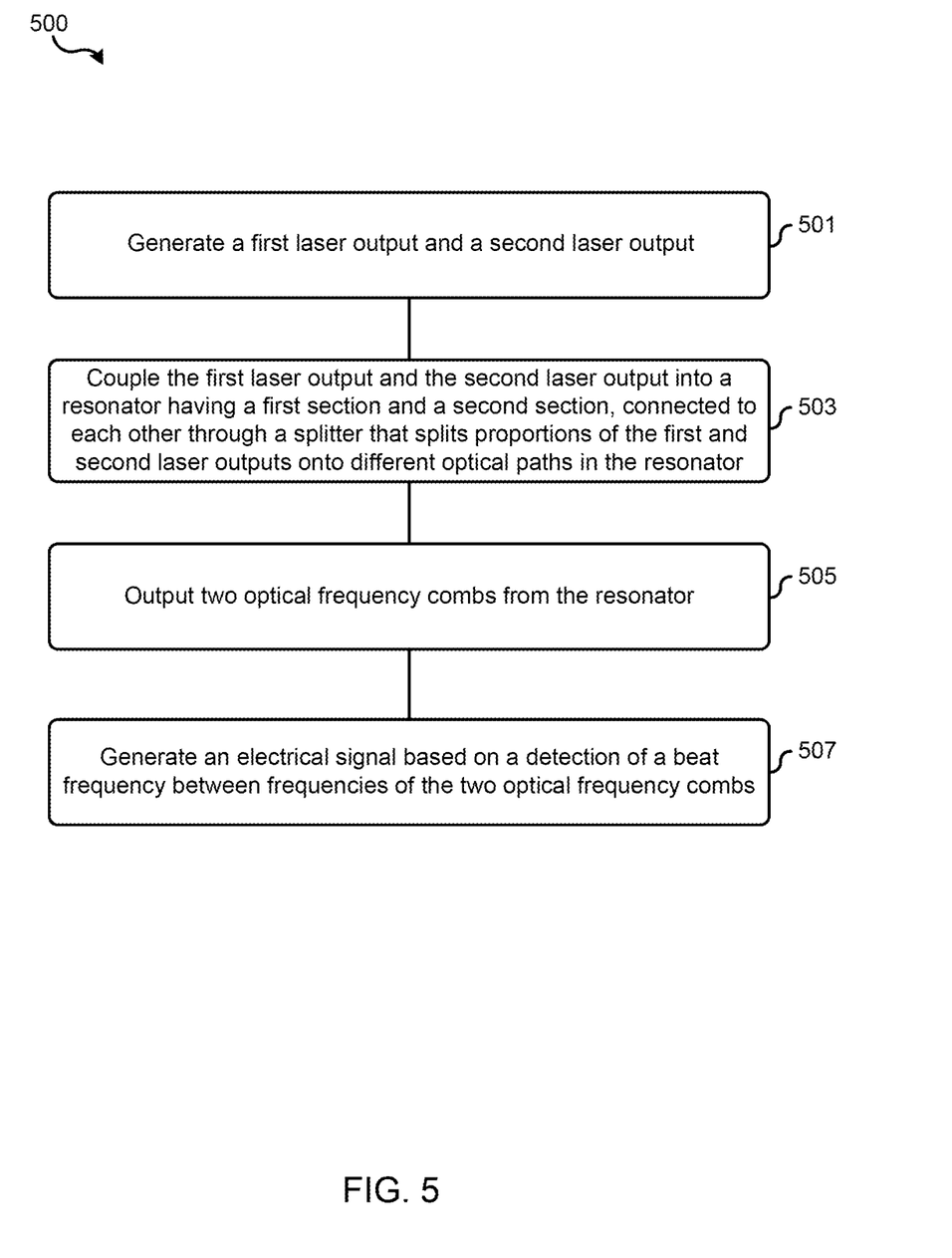
FIG. 5 is a flow diagram illustrating a method for tuning an RF synthesizer based on optical frequency combs according to an aspect of the present disclosure.

FIG. 5 depicts a flow diagram illustrating an exemplary method 500 for providing a tunable RF synthesizer based on offset optical frequency combs. The method 500 may be implemented via the techniques described with respect to FIGS. 1-3, but may be implemented using other techniques and systems known to one having skill in the art. The blocks of the flow diagram have been arranged in a generally sequential manner to facilitate explanation. But, the arrangement of the blocks is merely exemplary, and the blocks can be arranged in any manner sufficient to provide the functionality described above with respect to FIGS. 1-3.

In certain embodiments, the method 500 proceeds at 501, where a first laser output and a second laser output are generated. For example, the system may include two lasers (such as lasers 107 and 109 in FIG. 1), where each laser provides a different laser output. In some implementations, the lasers may be SBS lasers (such as SBS lasers 307 and 309). As described above, the SBS lasers may provide a low noise laser output for subsequent use within a respective system.

In exemplary embodiments, the method proceeds at 503, where the first laser output and the second laser output are coupled into a resonator having a first section and a second section that are connected to each other through a splitter that splits proportions of the first and second lasers onto different optical paths in the resonator. For example, a coupler may receive the first and second laser output from the lasers and couple a portion of the laser outputs into the resonator. In additional implementations, the laser output may be modulated before coupling into the resonator. While propagating within the resonator, a splitter may couple a proportion of the first and second laser outputs onto different optical paths. For example, a controller may send a control signal to the splitter that causes the splitter to change the proportion of light split by the splitter. The splitter may include a microheater or PZT device that causes the proportion of the light that is split to change.

In certain embodiments, the method proceeds at 505, where two optical frequency combs are output from the resonator. For example, after propagating along different optical paths, the coupler couples a portion of the propagating light out of the resonator as different optical frequency combs that are separated by a frequency difference, where the magnitude of the frequency difference is proportional to the proportion of the light split by the splitter within the resonator. As the splitter is controllable as described above, the magnitude of the frequency difference is likewise controllable, allowing for the tuning of the frequency difference along a range of frequencies.

In further embodiments, the method proceeds at 507, where an electrical signal is generated based on a detection of a beat frequency between frequencies of the two optical frequency combs. For example, a photodetector may receive the optical frequency combs and provide an electrical signal based on the beat frequency or difference between the frequencies of the two optical frequency combs. The electrical signal may then be filtered to remove non-desired harmonics from the electrical signal. Additionally, the electrical signal may be demodulated and provided to a controller that uses the electrical signal to determine whether the lasers are providing laser outputs at the desired resonant frequencies. The controller can also send control signals to the lasers to adjust the frequencies of the laser outputs to track the resonance of the resonator. Also, a system can provide the electrical signal to an external system that instructs the controller to tune the splitter such that the detector provides an electrical signal at the desired frequency. Alternatively, the controller can be pre-programmed to tune the splitter to cause a desired frequency separation between the optical frequency combs. Accordingly, the systems and methods herein provide a low-noise, tunable RF frequency signal.

Example Embodiments

Example 1 includes a system comprising: at least two lasers, wherein a first laser in the at least two lasers generates a first laser output and a second laser in the at least two lasers generates a second laser output; a coupler that receives the first laser output and the second laser output; a resonator having a first section and a second section, wherein the first section is coupled to the second section, wherein the coupler couples the first laser output and the second laser output into the resonator; a splitter that couples the first section to the second section, wherein the splitter splits a first proportion of the first laser output and a second proportion of the second laser output onto different optical paths within the resonator to generate optical frequency combs associated with different resonant frequencies of each of the different optical paths; and a controller that controls the splitter to change a size of the first proportion in relation to the first laser output and a size of the second proportion in relation to the second laser output.

Example 2 includes the system of Example 1, wherein the splitter comprises at least one of: a microheater; and a piezoelectric transducer.

Example 3 includes the system of any of Examples 1-2, further comprising a photodetector coupled to an output of the resonator, wherein the photodetector detects a beat frequency between frequencies of the optical frequency combs and provides an electrical output signal.

Example 4 includes the system of Example 3, further comprising a filter configured to receive the electrical output signal and remove higher order harmonics of a desired RF frequency from the electrical output signal.

Example 5 includes the system of any of Examples 1-4, wherein the at least two lasers are stimulated Brillouin scattering (SBS) lasers.

Example 6 includes the system of Example 5, further comprising an SBS laser control device that controls resonance frequencies of SBS resonators that produce the first laser output and the second laser output.

Example 7 includes the system of any of Examples 1-6, further comprising a coupler controller that controls a coupling rate for the coupler.

Example 8 includes the system of any of Examples 1-7, further comprising a PDH loop for locking a frequency of the first laser output and the second laser output to a resonant frequency of the resonator.

Example 9 includes the system of any of Examples 1-8, further comprising a phase modulator for modulating a phase of the first laser output and the second laser output before coupling into the resonator.

Example 10 includes a method comprising: generating a first laser output and a second laser output; coupling the first laser output and the second laser output into a resonator having a first section and a second section, wherein the first section is coupled to the second section through a splitter that splits a first proportion of the first laser output and a second proportion of the second laser output onto different optical paths in the resonator; outputting two optical frequency combs from the resonator; and generating an electrical signal based on a detection of a beat frequency between frequencies of the two optical frequency combs.

Example 11 includes the method of Example 10, wherein generating the first laser output and the second laser output comprises generating the first laser output and the second laser output with at least two stimulated Brillouin scattering (SBS) lasers.

Example 12 includes the method of Example 11, wherein an SBS laser control device controls a resonance frequency of SBS resonators that produce the first laser output and the second laser output.

Example 13 includes the method of any of Examples 10-12, further comprising controlling the splitter to change a size of the first proportion in relation to the first laser output and the second proportion in relation to the second laser output.

Example 14 includes the method of Example 13, wherein controlling the splitter to change splitting rate comprises providing a control signal to at least one of a: a microheater; and a piezoelectric transducer.

Example 15 includes the method of any of Examples 10-14, further comprising filtering the electrical signal to remove higher order harmonics of a desired RF frequency.

Example 16 includes the method of any of Examples 10-15, further comprising controlling the coupling of the first laser output and the second laser output into the resonator.

Example 17 includes a system comprising: at least two stimulated Brillouin scattering (SBS) lasers, wherein a first SBS laser in the at least two SBS lasers generates a first laser output and a second SBS laser in the at least two SBS laser generates a second laser output; a coupler that receives the first laser output and the second laser output; a resonator having a first section and a second section, wherein the first section is coupled to the second section, and the coupler couples the first laser output and the second laser output into the resonator; a splitter that couples the first section to the second section, wherein the splitter splits a first proportion of the first laser output and a second proportion of the second laser output onto different optical paths within the resonator to generate two optical frequency combs; a detector that generates an electrical signal based on frequencies of the two optical frequency combs received from an output of the resonator; and a controller that controls the splitter to change a size of the first proportion in relation to the first laser output and the second proportion in relation to the second laser output.

Example 18 includes the system of Example 17, wherein the splitter comprises at least one of: a microheater; and a piezoelectric transducer.

Example 19 includes the system of any of Examples 17-18, further comprising an SBS laser control device that controls a resonant frequency of SBS resonators that produce the first laser output and the second laser output.

Example 20 includes the system of any of Examples 17-19, further comprising a filter configured to receive the electrical signal and remove higher order harmonics of a desired RF frequency from the electrical signal.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof

What is claimed is:

1. A system comprising:
   at least two lasers, wherein a first laser in the at least two lasers generates a first laser output and a second laser in the at least two lasers generates a second laser output;
   a coupler that receives the first laser output and the second laser output;
   a resonator having a first section and a second section, wherein the first section is coupled to the second section, wherein the coupler couples the first laser output and the second laser output into the resonator;
   a splitter that couples the first section to the second section, wherein the splitter splits a first proportion of the first laser output and a second proportion of the second laser output onto different optical paths within the resonator to generate optical frequency combs associated with different resonant frequencies of each of the different optical paths; and
   a controller that controls the splitter to change a size of the first proportion in relation to the first laser output and a size of the second proportion in relation to the second laser output.

2. The system of claim 1, wherein the splitter comprises at least one of:
   a microheater; and
   a piezoelectric transducer.

3. The system of claim 1, further comprising a photodetector coupled to an output of the resonator, wherein the photodetector detects a beat frequency between frequencies of the optical frequency combs and provides an electrical output signal.

4. The system of claim 3, further comprising a filter configured to receive the electrical output signal and remove higher order harmonics of a desired RF frequency from the electrical output signal.

5. The system of claim 1, wherein the at least two lasers are stimulated Brillouin scattering (SBS) lasers.

6. The system of claim 5, further comprising an SBS laser control device that controls resonance frequencies of SBS resonators that produce the first laser output and the second laser output.

7. The system of claim 1, further comprising a coupler controller that controls a coupling rate for the coupler.

8. The system of claim 1, further comprising a PDH loop for locking a frequency of the first laser output and the second laser output to a resonant frequency of the resonator.

9. The system of claim 1, further comprising a phase modulator for modulating a phase of the first laser output and the second laser output before coupling into the resonator.

10. A method comprising:
    generating a first laser output and a second laser output;
    coupling the first laser output and the second laser output into a resonator having a first section and a second section, wherein the first section is coupled to the second section through a splitter that splits a first proportion of the first laser output and a second proportion of the second laser output onto different optical paths in the resonator;
    outputting two optical frequency combs from the resonator; and
    generating an electrical signal based on a detection of a beat frequency between frequencies of the two optical frequency combs.

11. The method of claim 10, wherein generating the first laser output and the second laser output comprises generating the first laser output and the second laser output with at least two stimulated Brillouin scattering (SBS) lasers.

12. The method of claim 11, wherein an SBS laser control device controls a resonance frequency of SBS resonators that produce the first laser output and the second laser output.

13. The method of claim 10, further comprising controlling the splitter to change a size of the first proportion in relation to the first laser output and the second proportion in relation to the second laser output.

14. The method of claim 13, wherein controlling the splitter to change splitting rate comprises providing a control signal to at least one of a:
    a microheater; and
    a piezoelectric transducer.

15. The method of claim 10, further comprising filtering the electrical signal to remove higher order harmonics of a desired RF frequency.

16. The method of claim 10, further comprising controlling the coupling of the first laser output and the second laser output into the resonator.

17. A system comprising:
    at least two stimulated Brillouin scattering (SBS) lasers, wherein a first SBS laser in the at least two SBS lasers generates a first laser output and a second SBS laser in the at least two SBS laser generates a second laser output;
    a coupler that receives the first laser output and the second laser output;
    a resonator having a first section and a second section, wherein the first section is coupled to the second section, and the coupler couples the first laser output and the second laser output into the resonator;
    a splitter that couples the first section to the second section, wherein the splitter splits a first proportion of the first laser output and a second proportion of the second laser output onto different optical paths within the resonator to generate two optical frequency combs;
    a detector that generates an electrical signal based on frequencies of the two optical frequency combs received from an output of the resonator; and a controller that controls the splitter to change a size of the first proportion in relation to the first laser output and the second proportion in relation to the second laser output.

18. The system of claim 17, wherein the splitter comprises at least one of:

a microheater; and a piezoelectric transducer.

19. The system of claim 17, further comprising an SBS laser control device that controls a resonant frequency of SBS resonators that produce the first laser output and the second laser output.

20. The system of claim 17, further comprising a filter configured to receive the electrical signal and remove higher order harmonics of a desired RF frequency from the electrical signal.

* * * * *